United States Patent
Lin et al.

(10) Patent No.: US 11,621,391 B2
(45) Date of Patent: Apr. 4, 2023

(54) ANTIFERROMAGNET BASED SPIN ORBIT TORQUE MEMORY DEVICE

(71) Applicant: Intel Corporation, Santa Clara, CA (US)

(72) Inventors: Chia-Ching Lin, Portland, OR (US); Sasikanth Manipatruni, Portland, OR (US); Tanay Gosavi, Hillsboro, OR (US); Dmitri Nikonov, Beaverton, OR (US); Kaan Oguz, Beaverton, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 816 days.

(21) Appl. No.: 16/236,060

(22) Filed: Dec. 28, 2018

(65) Prior Publication Data

US 2020/0212291 A1 Jul. 2, 2020

(51) Int. Cl.
| | | |
|---|---|---|
| *H01L 43/02* | (2006.01) | |
| *H01L 43/10* | (2006.01) | |
| *H01L 43/12* | (2006.01) | |
| *H01L 27/22* | (2006.01) | |
| *H01F 10/32* | (2006.01) | |
| *G11C 11/16* | (2006.01) | |
| *G11C 11/14* | (2006.01) | |
| *H01L 27/11* | (2006.01) | |

(52) U.S. Cl.
CPC .............. *H01L 43/02* (2013.01); *G11C 11/14* (2013.01); *G11C 11/161* (2013.01); *H01F 10/329* (2013.01); *H01F 10/3254* (2013.01); *H01F 10/3268* (2013.01); *H01F 10/3286* (2013.01); *H01L 27/11* (2013.01); *H01L 27/226* (2013.01); *H01L 43/10* (2013.01); *H01L 43/12* (2013.01); *G11C 11/1673* (2013.01); *G11C 11/1675* (2013.01)

(58) Field of Classification Search
None
See application file for complete search history.

(56) References Cited

U.S. PATENT DOCUMENTS

| | | | | |
|---|---|---|---|---|
| 9,608,039 | B1 * | 3/2017 | Apalkov | G11C 11/161 |
| 9,953,692 | B1 * | 4/2018 | Mihajlovic | G11C 11/1675 |
| 2016/0300999 | A1 * | 10/2016 | Yi | G11C 11/1675 |
| 2017/0178705 | A1 * | 6/2017 | Buhrman | G11C 11/18 |
| 2019/0312198 | A1 * | 10/2019 | Sun | H01L 43/08 |

* cited by examiner

*Primary Examiner* — Benjamin P Sandvik
(74) *Attorney, Agent, or Firm* — Schwabe, Williamson & Wyatt, P.C.

(57) ABSTRACT

A memory device comprises an interconnect comprises a spin orbit coupling (SOC) material. A free magnetic layer is on the interconnect, a barrier material is over the free magnetic layer and a fixed magnetic layer is over the barrier material, wherein the free magnetic layer comprises an antiferromagnet. In another embodiment, memory device comprises a spin orbit coupling (SOC) interconnect and an antiferromagnet (AFM) free magnetic layer is on the interconnect. A ferromagnetic magnetic tunnel junction (MTJ) device is on the AFM free magnetic layer, wherein the ferromagnetic MTJ comprises a free magnet layer, a fixed magnet layer, and a barrier material between the free magnet layer and the fixed magnet layer.

21 Claims, 7 Drawing Sheets

ANTIFERROMAGNET BASED SPIN ORBIT TORQUE MEMORY DEVICE

TECHNICAL FIELD

Embodiments of the disclosure are in the field of integrated circuit structures and, in particular, an antiferromagnet based spin orbit torque memory device.

BACKGROUND

For the past several decades, the scaling of features in integrated circuits has been a driving force behind an ever-growing semiconductor industry. Scaling to smaller and smaller features enables increased densities of functional units on the limited real estate of semiconductor chips. For example, shrinking transistor size allows for the incorporation of an increased number of memory devices on a chip, lending to the fabrication of products with increased functionality. The drive for ever-more functionality, however, is not without issue. The necessity to optimize the performance of each device becomes increasingly significant.

Non-volatile embedded memory, e.g., on-chip embedded memory with non-volatility can enable energy and computational efficiency. However, leading embedded memory options such as spin torque transfer magnetoresistive random access memory (STT-MRAM) can suffer from high voltage and high current-density problems during the programming (writing) of the cell. Furthermore, the density limitations of STT-MRAM may be due to large write switching current and select transistor requirements. Specifically, traditional STT-MRAM has a cell size limitation due to the drive transistor requirement to provide sufficient spin current. Furthermore, such memory is associated with large write current (>100 µA) and voltage (>0.7 V) requirements of conventional magnetic tunnel junction (MTJ) based devices.

As such, significant improvements are still needed in the area of non-volatile memory arrays based on MTJs.

DESCRIPTION OF THE EMBODIMENTS

Figure 1:
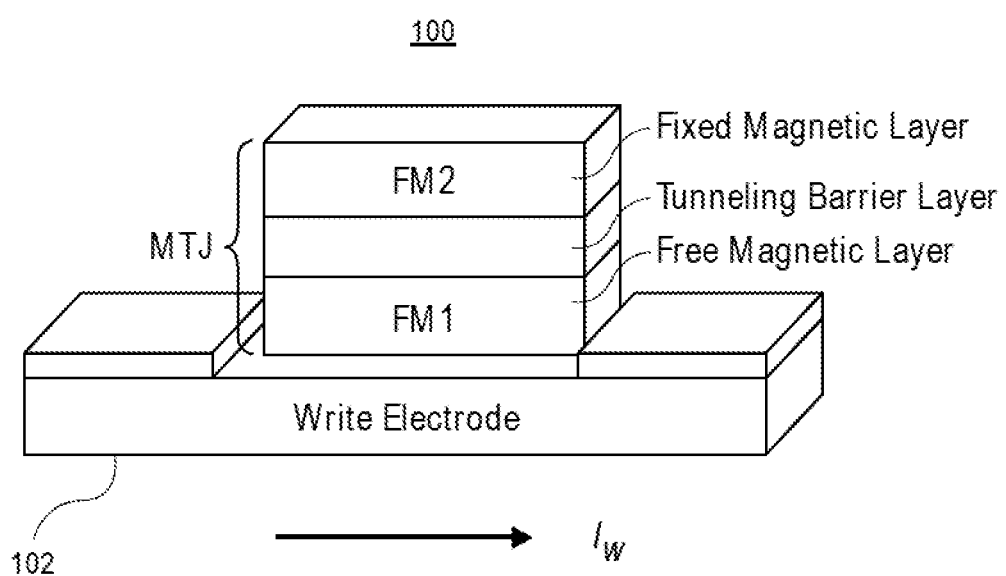
FIG. 1 illustrates a state of the art material stack for a SOT (Spin Orbit Torque) based MTJ (Magnetic Tunnel Junction) memory device, according to one embodiment.

Embodiments for a filter layer for an antiferromagnet based spin orbit torque (SOT) memory device are described. In the following description, numerous specific details are set forth, such as specific material and tooling regimes, in order to provide a thorough understanding of embodiments of the present disclosure. It will be apparent to one skilled in the art that embodiments of the present disclosure may be practiced without these specific details. In other instances, well-known features, such as single or dual damascene processing, are not described in detail in order to not unnecessarily obscure embodiments of the present disclosure. Furthermore, it is to be understood that the various embodiments shown in the FIGS. are illustrative representations and are not necessarily drawn to scale. In some cases, various operations will be described as multiple discrete operations, in turn, in a manner that is most helpful in understanding the present disclosure, however, the order of description should not be construed to imply that these operations are necessarily order dependent. In particular, these operations need not be performed in the order of presentation.

Certain terminology may also be used in the following description for the purpose of reference only, and thus are not intended to be limiting. For example, terms such as "upper", "lower", "above", "below," "bottom," and "top" refer to directions in the drawings to which reference is made. Terms such as "front", "back", "rear", and "side" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

Embodiments described herein may be directed to front-end-of-line (FEOL) semiconductor processing and structures. FEOL is the first portion of integrated circuit (IC) fabrication where the individual devices (e.g., transistors, capacitors, resistors, etc.) are patterned in the semiconductor substrate or layer. FEOL generally covers everything up to (but not including) the deposition of metal interconnect layers. Following the last FEOL operation, the result is typically a wafer with isolated transistors (e.g., without any wires).

Embodiments described herein may be directed to back end of line (BEOL) semiconductor processing and structures. BEOL is the second portion of IC fabrication where the individual devices (e.g., transistors, capacitors, resistors, etc.) are interconnected with wiring on the wafer, e.g., the metallization layer or layers. BEOL includes contacts, insulating layers (dielectrics), metal levels, and bonding sites for chip-to-package connections. In the BEOL part of the fabrication stage contacts (pads), interconnect wires, vias and dielectric structures are formed. For modern IC processes, more than 10 metal layers may be added in the BEOL.

Embodiments described below may be applicable to FEOL processing and structures, BEOL processing and structures, or both FEOL and BEOL processing and structures. In particular, although an exemplary processing scheme may be illustrated using a FEOL processing scenario, such approaches may also be applicable to BEOL processing. Likewise, although an exemplary processing scheme may be illustrated using a BEOL processing scenario, such approaches may also be applicable to FEOL processing.

One or more embodiments of the present invention is directed to an antiferromagnet based spin orbit torque (SOT) memory device. General applications of such an array include, but are not limited to, magnetic tunnel junction architectures, MRAM, non-volatile memory, spin torque memory, and embedded memory using magnetic memory devices.

More specifically, one or more embodiments target the use or application of an antiferromagnet based spin orbit torque (SOT) memory device, such as an e-MRAM or e-SRAM, having an interconnect comprising a spin orbit coupling material. A free layer magnet comprising an antiferromagnet (rather than a ferromagnet) is on the interconnect, a barrier material is over the free layer magnet and a reference fixed magnet is over the barrier material. In another aspect, a memory device comprises a spin orbit coupling (SOC) interconnect and an antiferromagnet (AFM) free magnetic layer on the interconnect. A ferromagnetic magnetic tunnel junction (MTJ) device is on the AFM free magnetic layer, wherein the ferromagnetic MTJ comprises a free magnet layer, a fixed magnet layer, and a barrier material between the free magnet layer and the fixed magnet layer. According to the disclosed embodiments, the antiferromagnet based SOT memory device has fast switching, high thermal stability, flexible geometry, and little to no stray field.

In order to provide context, FIG. 1 illustrates a state of the art material stack 100 for a SOT (Spin Orbit Torque) based MTJ (Magnetic Tunnel Junction) memory device, according to one embodiment. As is well known, the MTJ material stack 100 stores data as a resistance state value. The MTJ device stack comprises two independent ferromagnetic layers referred to as a free magnetic layer (FM1) and a reference fixed magnetic layer (FM2) that are separated by an insulating tunneling barrier layer. The material for the tunneling barrier layer is sufficiently thin such that electrons can tunnel there through. The magnetic field of the free magnetic layer FM1 is free to rotate based on a direction of a current, i.e., the spin of the electrons, flowing through the MTJ device stack. In contrast, the fixed magnetic layer has a fixed magnetization, and is therefore referred to as a fixed or reference layer. The free magnetic layer FM1 of the material stack is in direct contact with an interconnect 102, e.g., a write electrode, comprising a spin orbit coupling (SOC) material.

The MTJ functions essentially as a resistor, where the resistance of an electrical path through the MTJ may exist in two resistive states, either "high" or "low," depending on the direction or orientation of magnetization in the free magnetic layer FM1 and in the fixed magnetic FM2. In the case that the directions of magnetization in the free magnetic layer FM1 and the fixed magnetic FM2 closest to it are substantially not aligned or not parallel with one another (typically two are perpendicular to each other), a high resistive state exists. In the case that the directions of magnetization in the coupled free magnetic layer and the fixed magnetic layer closest to it are substantially aligned or parallel with one another, a low resistive state exists. It is to be understood that the terms "low" and "high" with regard to the resistive state of the MTJ are relative to one another. In other words, the high resistive state is merely a detectibly higher resistance than the low resistive state, and vice versa. Thus, with a detectible difference in resistance, the low and high resistive states can represent different bits of information (i.e. a "0" or a "1").

In some embodiments, the MTJ may further include a synthetic antiferromagnet (SAF) stack (not shown) over the MTJ to cancel dipole fields around the free magnetic layer FM1. A top electrode (not shown) completes the material stack. A wide combination of materials can be used for material stacking of the MTJ device and the SAF stack. For example, in the embodiment shown, the free magnetic layer FM1 and the fixed magnetic layer FM2 may both comprise $Co_xFe_yB_z$ (Cobalt, Iron, Boron), where 'x,' 'y,' and 'z' are integers. The barrier material typically comprises an oxide layer such as magnesium oxide (MgO).

An SOT material stack when used as a perpendicular spin-orbit torque (pSOT) device is one of the promising e-SRAM solutions for future technology nodes. However, providing a stable p-MTJ stack on SOC material interconnect 102 presents a challenges, such as ensuring sufficiently fast switching and a stable SAF stack.

In accordance with various embodiments of the present disclosure, an improved SOT MRAM memory, and more particularly, an improved perpendicular SOT embedded Static RAM (e-SRAM) and/or e-MRAM is described below. In one embodiment, an antiferromagnetic material is used to replace a ferromagnet as the free magnetic layer in the SOT stack of the SOT memory devices to increase switching speed and provide higher thermal stability, as shown in FIGS. 2A-2C.

Figure 2A:
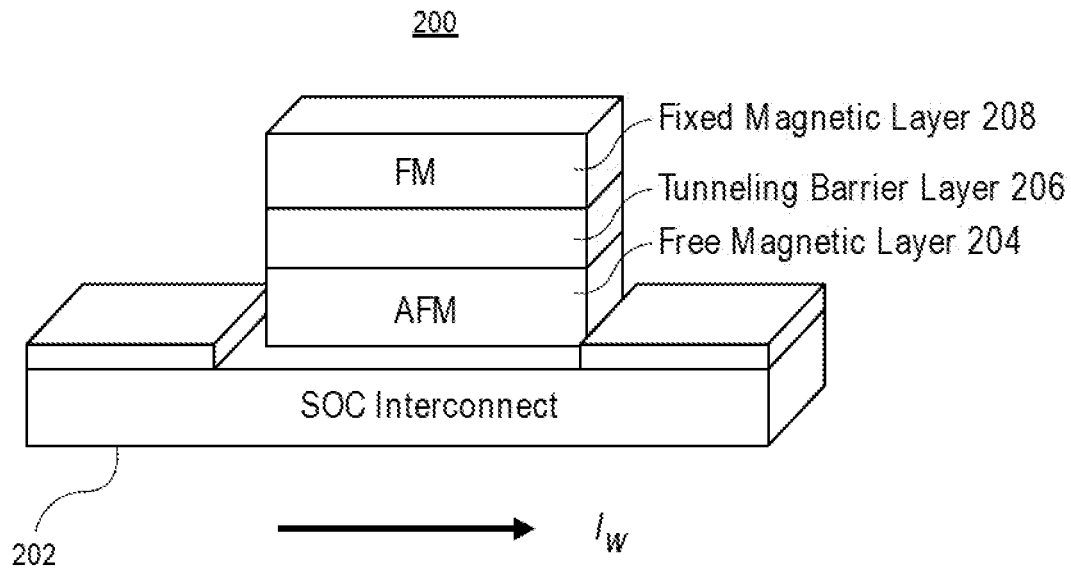
FIG. 2A illustrates an antiferromagnet (AFM)-based spin orbit torque (SOT) memory device.
Figure 2B:
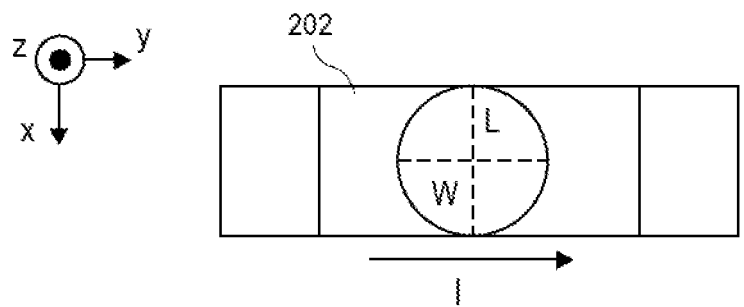
FIG. 2B is a top view of the device of FIG. 2A.
Figure 2C:
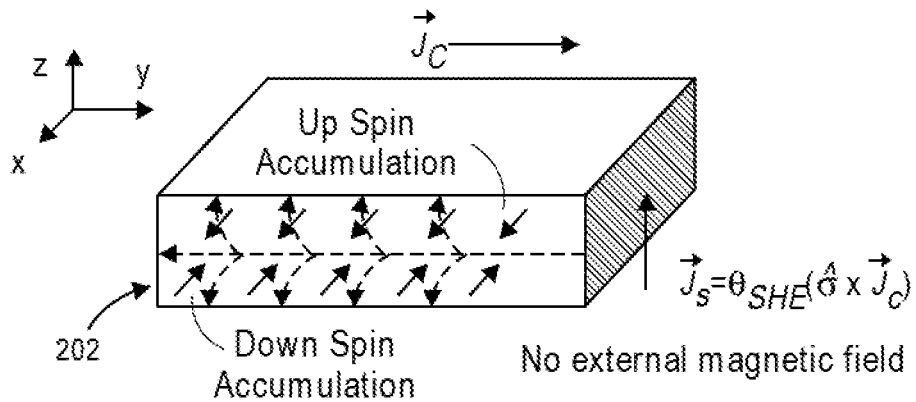
FIG. 2C is a cross-section of the SOT layer that shows direction of spin currents and charge currents as decided by SOT in metals.

FIG. 2A illustrates an antiferromagnet (AFM)-based spin orbit torque (SOT) memory device. In one embodiment, the AFM-based SOT memory device may comprise a perpendicular spin-orbit torque (pSOT) memory device 200. The pSOT memory device 200 includes an interconnect comprising a spin orbit coupling (SOC) material to provide a SOC interconnect 202. A free magnetic layer 204 is on the SOC interconnect 202, a tunneling barrier material 206 is over the free magnetic layer 204 and a fixed magnetic layer 208 is over the tunneling barrier material 206, wherein according to the disclosed embodiments, the free magnetic layer 204 comprises an antiferromagnet (AFM), rather than a ferromagnet.

In certain aspects and in at least some embodiments of the present invention, certain terms hold certain definable meanings. The free magnetic layer 204, the tunneling barrier material 206, and the fixed magnetic layer 208 comprise an antiferromagnet (AFM)-based device stack. The free magnetic layer 204 of the material stack is on and in contact with the SOC interconnect 202, e.g., a write electrode. The magnetic field of the free magnetic layer 204 is free to rotate based on a direction of a current, i.e., the spin of the electrons, flowing through the AFM device stack. For example, the free magnetic layer 204 is an antiferromagnet layer storing a computational variable. In contrast, the fixed magnetic layer 208 has a fixed magnetization, and is therefore referred to as a fixed or reference layer that is magnetically harder than the free magnetic layer.

In one embodiment, the free magnetic layer 204 comprises an AFM material including one of: Ir, Pt, Mn, Pd, or Fe. In some embodiments, the AFM material is a quasi-twodimensional triangular AFM including Ni(1-x)MxGa2S4, where 'M' includes one of: Mn, Fe, Co or Zn. The AFM material may range in thickness from approximately 1 to 20 nm.

In one embodiment, the fixed magnetic layer 208 comprises a ferromagnet (FM) including any combination of: CFGG (i.e., Cobalt (Co), Iron (Fe), Germanium (Ge), and Gallium (Ga)). In some embodiments, the fixed magnetic layer 208 comprises one or more of Co, Fe, Ni alloys and multilayer hetero-structures, various oxide ferromagnets, garnets, or Heusler alloys. For example, CoFeB, FeB, CoFe, LaSrMoO3(LSMO), Co/Pt, CoFeGd, and ferromagnetic semi-metal such as Weyl, and Heusler alloy such as Cu2MnAl, Cu2MnIn, Cu2MnSn can be used for the fixed magnetic layer 208. Heusler alloys are ferromagnetic metal alloys based on a Heusler phase. Heusler phases are intermetallic with certain composition and face-centered cubic crystal structure. The ferromagnetic property of the Heusler alloys are a result of a double-exchange mechanism between neighboring magnetic ions. In some embodiments, the Heusler alloy includes one of: Cu2MnAl, Cu2MnIn, Cu2MnSn, Ni2MnAl, Ni2MnIn, Ni2MnSn, Ni2MnSb, Ni2MnGa Co2MnAl, Co2MnSi, Co2MnGa, Co2MnGe, Pd2MnAl, Pd2MnIn, Pd2MnSn, Pd2MnSb, Co2FeSi, Co2FeAl, Fe2VAl, Mn2VGa, Co2FeGe, MnGa, or MnGaRu. The fixed magnetic layer 208 may range in thickness from approximately 1 to 20 nm.

The tunneling barrier material 206, such as a tunneling dielectric or oxide layer, is one located between free magnetic layer 204 and fixed magnetic layer 208. In one embodiment, tunneling barrier material 206 may comprise one of Mg, Al, or Ti. In one embodiment, tunneling barrier material 206 may range in thickness from approximately 0.5 to 10 nm.

FIG. 2B is a top view of the device of FIG. 2A. In FIG. 2B, the magnet is oriented along the width of the interconnect 202 or write electrode for appropriate spin injection. The magnetic cell is written by applying a charge current (I) via the SOC interconnect 202. The direction of the magnetic writing is decided by the direction of the applied charge current. Positive currents (along+y) produce a spin injection current with transport direction (along+z) and spins pointing to (+x) direction. The spin orbit coupling (SOC) material of interconnect 202 can impact both perpendicular and in plane magnetic free layers, and this disclosure may apply to both. Because what is known as the Spin Hall Effect may be responsible for the current-induced magnetization switch in the MTJ device, an SOT-MRAM may also be referred to as a Giant Spin Hall Effect (GSPHE) MRAM.

In some embodiments, the SOC material of interconnect 202 (or the write electrode) includes 3D materials such as one or more of β-Tantalum (β-Ta), Ta, β-Tungsten (β-W), W, Pt, Copper (Cu) doped with elements such as Iridium, Bismuth and any of the elements of 3d, 4d, 5d and 4f, 5f periodic groups in the Periodic Table which may exhibit high spin orbit coupling. In some embodiments, the SOC interconnect 202 comprises one or more of: Pt, Ta, W, WOx, CuBi, BiOx, Bi2Se3, Bi2Sb3, SrIrO3, or a stack of LaAlO3 (LAO) and SrTiO3 (STO). The thickness is ranges from approximately 1 to 20 nm.

FIG. 2C is a cross-section of the SOC interconnect 202 that shows direction of spin currents and charge currents as decided by SOC in metals. The injected spin current in-turn produces spin torque to align the magnet in the +x or −x direction. The transverse spin current for a charge current in the write electrode is provided in equation (1):

$$I_s = P_{she}(w, t, \lambda_{sf}, \theta_{SHE})(\infty I_c) \quad (1)$$

where $P_{SHE}$ is the spin hall injection efficiency, which is the ratio of magnitude of transverse spin current to lateral charge current, w is the width of the magnet, t is the thickness of the GSHE metal electrode, $\lambda_{sf}$ is the spin flip length in the GSHE metal, $\theta_{GSHE}$ is the spin hall angle for the GSHE-metal to the AFM free magnetic layer interface. The injected spin angular momentum responsible for spin torque can be determined by first solving equation 1.

The AFM free magnetic layer 204, tunneling barrier material 206, and fixed magnetic layer 208 comprise an AFM-based pSOT memory device that provides 1) fast switching; 2) high thermal stability; 3) flexible geometry; and 4) no stray field. As such, the AFM-based pSOT memory device is suitable for use as an e-MRAM or e-SRAM solution for systems on a chip (SoC).

Compared to ferromagnetic materials, the use of antiferromagnetic materials as the free magnetic layer 204 effectively provides the above-listed advantages. However, reading-out the signal of canting magnetization state can be challenging.

Some antiferromagnetic materials exhibit a non-zero magnetic moment at a temperature near absolute zero. This effect is attributed to spin canting in which spins are tilted by a small angle about their axis rather than being exactly co-parallel. Spin canting is due to two contrasting factors: isotropic exchange that aligns the spins antiparallel, and antisymmetric exchange arising from relativistic effects (spin-orbit coupling) that aligns the spins orthogonal to one another. The canting magnetization of antiferromagnetic materials can be manipulated by spin polarized current.

According to a further aspect of the disclosed embodiments, in one embodiment, the tunneling anisotropic magnetoresistance (TAMR) effect is used to read-out the canting magnetization state signal. In another embodiment, an antiferromagnet-coupled ferromagnetic MTJ is used to read-out the canting magnetization state signal. TAMR is the difference in resistance of a magnetic tunnel junction due to a change in magnetization direction of one or both magnetics with respect to current flow.

Figure 3A:
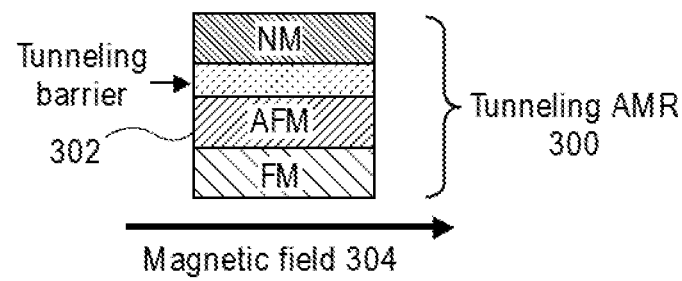
FIG. 3A illustrates a tunneling anisotropic magnetoresistance (AMR) device stack to describe the TAMR effect.

FIG. 3A illustrates a tunneling anisotropic magnetoresistance (AMR) device stack to describe the TAMR effect. As shown in FIG. 3A, the tunneling AMR device stack 300 is similar to the MTJ of FIG. 1 in that it includes a ferromagnet free layer nanomagnet (FM) and a fixed layer magnet (NM) separated by a tunneling barrier. However, the tunneling AMR device stack 300 further includes an antiferromagnet 302 between the ferromagnet free layer and the tunneling barrier. If the ferromagnet magnetization is switched by an external magnetic field 304, the canting magnetization of the antiferromagnet 302 is also changed due to a spin-string effect. When passing current from a normal metal, such as the fixed layer magnet (NM), through a tunneling barrier, to an antiferromagnet/ferromagnet, the resistance is also changed due to the change of antiferromagnet canting magnetization, which is the TAMR effect. The TAMR effect can result in a ratio greater than 100% between high resistance and low resistance.

According to a first embodiment, when replacing the ferromagnet to SOC interconnect with an antiferromagnet to SOC interconnect, the SOC interconnect is used to write the antiferromagnetic state of an AFM-based SOT memory device, while the TAMR effect is used to read-out the antiferromagnetic state of an AFM-based SOT memory device.

Figure 3B:
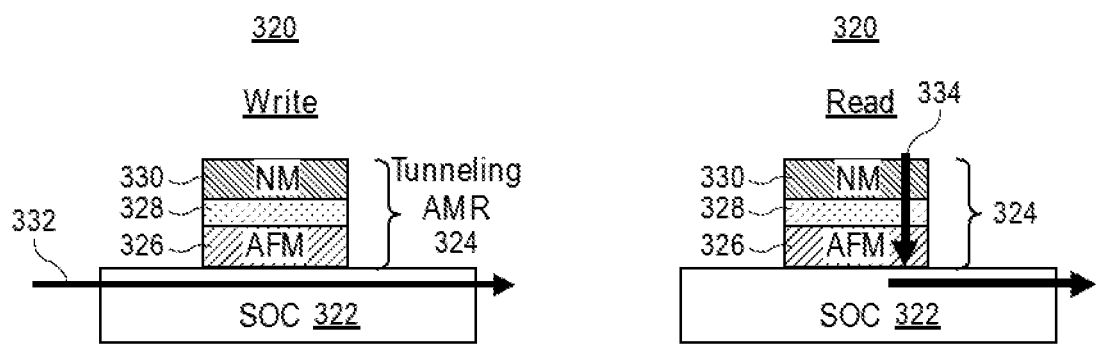
FIG. 3B graphically illustrates the use of the TAMR effect to write and read-out the antiferromagnetic state of the AFM-based SOT memory device.

FIG. 3B graphically illustrates the use of the TAMR effect to write and read-out the antiferromagnetic state of the AFM-based SOT memory device 320. The left-hand side of FIG. 3B illustrates a write operation performed on the AFM-based SOT memory device 320, and the right-hand side of FIG. 3B illustrates a read-out operation performed on the AFM-based SOT memory device 320. The AFM-based SOT memory device 320 comprises a SOC interconnect 322 and tunneling anisotropic magnetoresistance (AMR) device stack 324 over the SOC interconnect 322. The tunneling AMR device stack 324 comprises an AFM free magnetic layer 326 on the SOC interconnect 322, a tunneling barrier material 328 over the AFM free magnetic layer 326, and a fixed magnetic layer 330 over the tunneling barrier material 328.

During a write operation (left), a charge current 332 is passed through the SOC interconnect 322 (i.e., the write electrode) to induce spin currents that manipulate an antiferromagnetic state of the AFM free magnetic layer 326 into a first resistance state, which is detectable by the TAMR effect.

During a read-out operation (right), a charge current 334 is passed through a top of the tunneling AMR device stack 324 (e.g., from a top electrode) to induce spin currents that manipulate an antiferromagnetic state of the AFM free magnetic layer 326 into a second resistance state that is read through the SOC interconnect 322. Accordingly, an SOT memory device is provided through the use of AFM.

According to a second embodiment, an antiferromagnet to SOC interconnect is also utilized with a traditional MTJ to provide a second type of AFM-based SOT memory device.

Figure 3C:
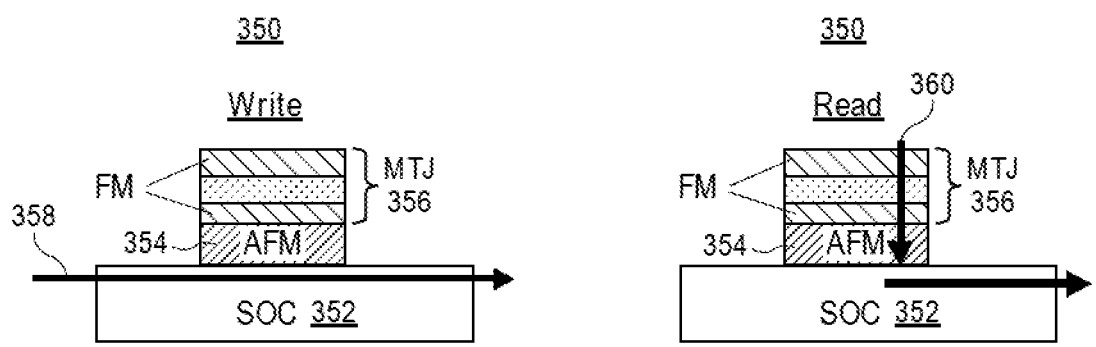
FIG. 3C graphically illustrates the use of the TAMR effect to write and read-out the antiferromagnetic state of an AFM-based SOT memory device comprising a normal ferromagnet-based MTJ on top of antiferromagnet free magnetic layer.

FIG. 3C graphically illustrates the use of the TAMR effect to write and read-out the antiferromagnetic state of an AFM-based SOT memory device 350 comprising a normal ferromagnet-based MTJ 356 on top of antiferromagnet (AFM) free magnetic layer 354. The left-hand side of FIG. 3C illustrates a write operation performed on the AFM-based SOT memory device 350, and the right-hand side of FIG. 3C illustrates a read-out operation performed on the AFM-based SOT memory device 350. The AFM-based SOT memory device 350 comprises a SOC interconnect 352 and an AFM free magnetic layer 354 on the SOC interconnect 352. A normal ferromagnet-based MTJ 356 is on the AFM free magnetic layer 354. In this embodiment, the AFM free magnetic layer 354 is coupled to free magnetic layer of the MTJ 356, and the SOC material of the SOC interconnect 352 is used to control the magnetization of the AFM free magnetic layer 354 and therefore the free magnetic layer of the MTJ 356.

During a write operation (left), a charge current 358 is passed through the SOC interconnect 352 (i.e., the write electrode) to induce spin currents that manipulate an antiferromagnetic state of the AFM free magnetic layer 354 and the free magnetic layer of MTJ 356 into a first resistance state. Because the AFM free magnetic layer 354 is coupled to free magnetic layer of the MTJ 356, when the state of the AFM free magnetic layer 354 is changed by SOC interconnect 352, the free magnetic layer of MTJ 356 is also changed, which is detectable by the normal Tunnel magnetoresistance (TMR).

During a read-out operation (right), a charge current 360 is passed through a top of the MTJ 356 (e.g., from a top electrode) to induce spin currents that manipulate an antiferromagnetic state of the AFM free magnetic layer 354 and the free magnetic layer of MTJ 356 into a second resistance state that is read through the SOC interconnect 352.

Figure 4:
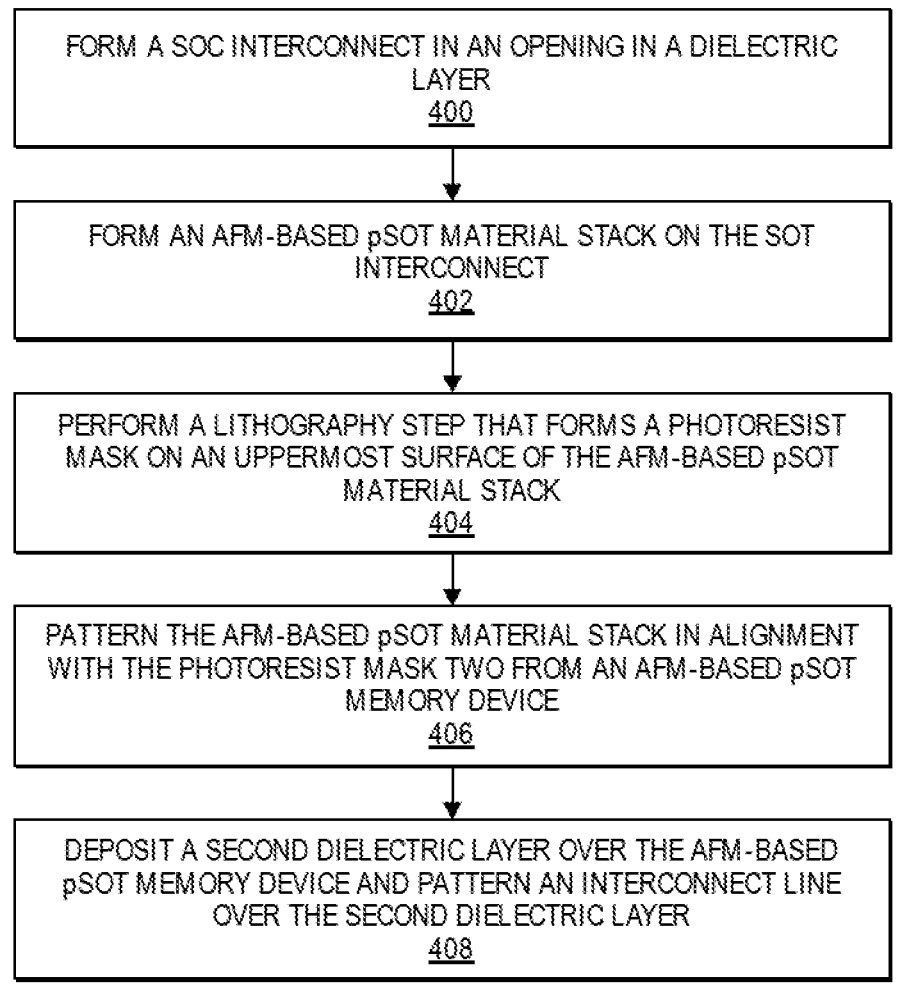
FIG. 4 is a flow diagram representing various operations in a method of fabricating an AFM-based pSOT memory device in accordance with the embodiments disclosed herein.

FIG. 4 is a flow diagram representing various operations in a method of fabricating an AFM-based SOT memory device in accordance with the embodiments disclosed herein. The process may include forming an SOC interconnect with a write electrode in an opening in a dielectric layer (block 400). In an embodiment, the SOC interconnect is formed in an opening in the dielectric layer above a substrate. The substrate may include a suitable semiconductor material such as but not limited to, single crystal silicon, polycrystalline silicon and silicon on insulator (SOI). In another embodiment, the substrate may include other semiconductor materials such as germanium, silicon germanium or a suitable group III-N or a group III-V compound.

In an embodiment, the SOC interconnect is formed in the dielectric layer by a damascene or a dual damascene process that is well known in the art. In an embodiment, both the SOC interconnect and the write electrode may comprises a Giant Spin Hall Effect (GSHE) metal made of β-Tantalum (β-Ta), β-Tungsten (β-W), W, Pt, Copper (Cu) doped with elements such as Iridium, Bismuth and any of the elements of 3d, 4d, 5d and 4f, 5f periodic groups in the periodic table. In an embodiment, the SOC interconnect is electrically connected to a circuit element such as an access transistor (not shown). Logic devices such as access transistors may be integrated with memory devices to form embedded memory.

An AFM-based pSOT material stack is formed on the SOC interconnect (block 402). First, an antiferromagnet (AFM) free magnetic layer is formed on the SOC interconnect. In one embodiment, the AFM free magnetic layer comprises an AFM material including one of: Ir, Pt, Mn, Pd, or Fe. In some embodiments, the AFM material is a quasi-two-dimensional triangular AFM including Ni(1-x)MxGa2S4, where 'M' includes one of: Mn, Fe, Co or Zn. The AFM material may range in thickness from approximately 1 to 20 nm.

A tunneling barrier material is formed over the AFM free magnetic layer. In one embodiment, tunneling barrier material may range in thickness from approximately 0.5 to 10 nm. A fixed magnetic layer is then formed over the tunneling barrier material to form the AFM-based pSOT material stack. The fixed magnetic layer may range in thickness from approximately 1 to 20 nm.

In one embodiment, the material layers of the AFM-based pSOT material stack are blanket deposited. The layers of the AFM-based pSOT material stack may be formed by sputter-deposition techniques with deposition rates in the Ångstrom-per-second range. The techniques include physical vapor deposition (PVD), specifically planar magnetron sputtering, and ion-beam deposition. In an embodiment, the AFM-based pSOT material stack may be subjected to an annealing process performed at a temperature between 300-400 degrees Celsius. In an embodiment, layers of the AFM-based pSOT material stack may be respectively blanket deposited by an evaporation process, an atomic layer deposition (ALD) process or by chemical vapor deposition (CVD) process. In an embodiment, the chemical vapor deposition process is enhanced by plasma techniques such as RF glow discharge (plasma enhanced CVD) to increase the density and uniformity of the film. In an embodiment, an uppermost layer of material layer stack may include the top electrode layer that ultimately acts as a hardmask.

The deposition process can be configured to control the magnetic properties of the magnetic layers. For example, the direction of the magnetic anisotropy of the ferromagnetic materials can be set during the deposition of the layer by applying a magnetic field across the wafer. The resulting uniaxial anisotropy is observed as magnetic easy and hard directions in the magnetization of the layer. Since the anisotropy axis affects the switching behavior of the material, the deposition system must be capable of projecting a uniform magnetic field across the wafer, typically in the 20-100 Oe range, during deposition. The deposition process can control other magnetic properties, such as coercivity and magnetorestriction, by the choice of magnetic alloy and deposition conditions. Because the switching field of a patterned bit depends directly on the thickness of the free layer magnet, the thickness uniformity and repeatability must meet strict requirements.

A lithography step is performed to form a photoresist mask on an uppermost surface of the AFM-based pSOT material stack (block 404). In an embodiment, the photoresist mask is formed at a minimum size required for the memory element AFM-based pSOT material stack, and defines a location where a memory cell will be subsequently formed. In one embodiment, example minimum sizes for the resist could be in the range of 10 nm-100 nm.

The AFM-based pSOT material stack is then patterned in alignment with the photoresist mask to form an active AFM-based pSOT memory device/cell (block 406). In an embodiment, a plasma etch process is utilized to pattern the AFM-based pSOT material stack down to the SOC interconnect.

A second dielectric layer is deposited over the AFM-based pSOT memory device and a top electrode and an interconnect line (e.g. a bit line) are patterned over the second dielectric layer (block 408). The memory cell may be completed by removing the photoresist mask and then forming the second dielectric layer on the bit line and on the active memory device (on the hardmask, on sidewalls of the memory device, resistive element and memory element). The second dielectric letter is planarized to expose an uppermost surface of the top electrode. Thereafter, the bit line is patterned on the uppermost surface of the top electrode and on the uppermost surface of the second dielectric layer to complete formation of the memory cell. In an embodiment, the bit line may comprise conductive material such as W, TiN, TaN or Ru. In an embodiment, the bit line is formed by using a dual damascene process (not shown) and includes a barrier layer such as Ru, Ta or Ti and a fill metal such as W or Cu.

It is to be appreciated that the layers and materials described in association with embodiments herein are typically formed on or above an underlying semiconductor substrate, e.g., as FEOL layer(s). In other embodiments, the layers and materials described in association with embodiments herein are formed on or above underlying device layer(s) of an integrated circuit, e.g., as BEOL layer(s). In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, although not depicted, structures described herein may be fabricated on underlying lower level back end of line (BEOL) interconnect layers. For example, in one embodiment, an embedded non-volatile memory structure is formed on a material composed of a dielectric material such as, but not limited to, silicon dioxide, silicon oxy-nitride, silicon nitride, or carbon-doped silicon nitride. In a particular embodiment, an embedded non-volatile memory structure is formed on a low-k dielectric layer of an underlying BEOL layer.

Figure 5B:
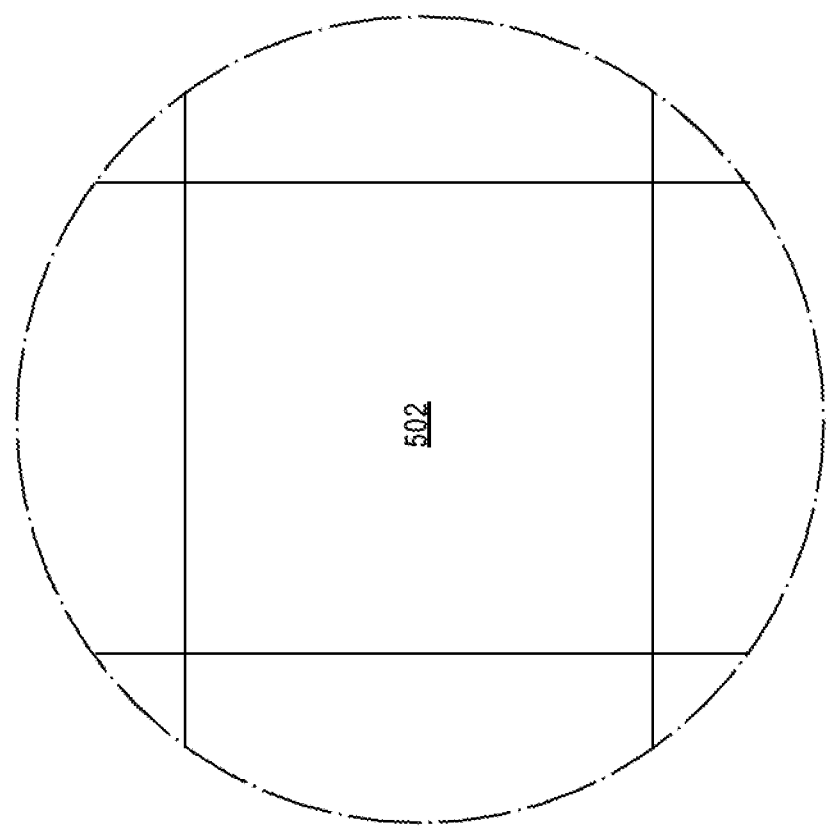
FIGS. 5A and 5B illustrate a wafer composed of semiconductor material and that includes one or more dies having integrated circuit (IC) structures formed on a surface of the wafer.
Figure 5A:
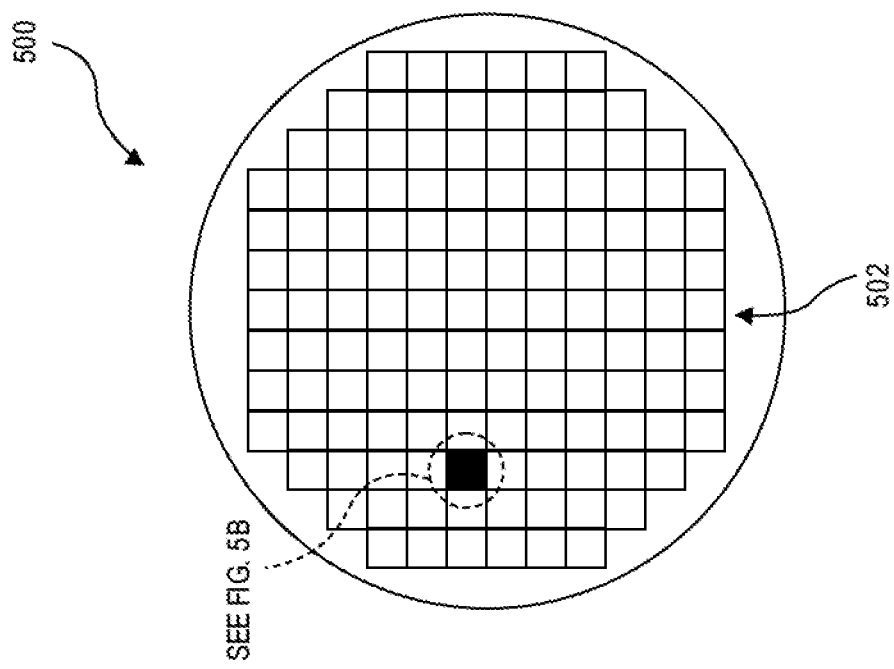

Referring to FIGS. 5A and 5B, a wafer 500 may be composed of semiconductor material and may include one or more dies 502 having integrated circuit (IC) structures formed on a surface of the wafer 500. Each of the dies 502 may be a repeating unit of a semiconductor product that includes any suitable IC (e.g., ICs including one or more embedded non-volatile memory structures having an AFM-based pSOT memory device, such as described above. After the fabrication of the semiconductor product is complete, the wafer 500 may undergo a singulation process in which each of the dies 502 is separated from one another to provide discrete "chips" of the semiconductor product. In particular, structures that include embedded non-volatile memory structures having an AFM-based pSOT memory device as disclosed herein may take the form of the wafer 500 (e.g., not singulated) or the form of the die 502 (e.g., singulated). The die 502 may include one or more embedded non-volatile memory structures having an AFM-based pSOT memory device and/or supporting circuitry to route electrical signals, as well as any other IC components. In some embodiments, the wafer 500 or the die 502 may include an additional memory device (e.g., a static random access memory (SRAM) device), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processing device or other logic that is configured to store information in the memory devices or execute instructions stored in the memory array.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 6:
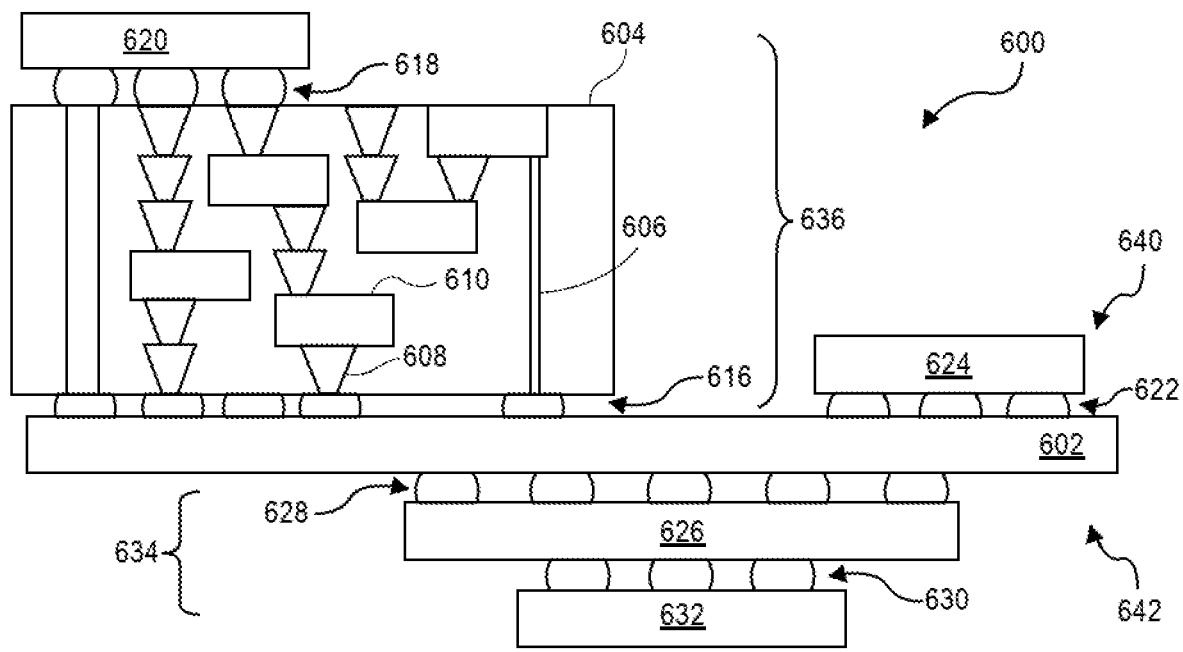
FIG. 6 is a cross-sectional side view of an integrated circuit (IC) device assembly that may include one or more embedded non-volatile memory structures having an AFM-based pSOT memory device.

FIG. 6 is a cross-sectional side view of an integrated circuit (IC) device assembly that may include one or more embedded non-volatile memory structures having an AFM-based pSOT memory device, in accordance with one or more of the embodiments disclosed herein.

Referring to FIG. 6, an IC device assembly 600 includes components having one or more integrated circuit structures described herein. The IC device assembly 600 includes a number of components disposed on a circuit board 602 (which may be, e.g., a motherboard). The IC device assembly 600 includes components disposed on a first face 640 of the circuit board 602 and an opposing second face 642 of the circuit board 602. Generally, components may be disposed on one or both faces 640 and 642. In particular, any suitable ones of the components of the IC device assembly 600 may include a number of embedded non-volatile memory structures having an AFM-based pSOT memory device, such as disclosed herein.

In some embodiments, the circuit board 602 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 602. In other embodiments, the circuit board 602 may be a non-PCB substrate.

The IC device assembly 600 illustrated in FIG. 6 includes a package-on-interposer structure 636 coupled to the first face 640 of the circuit board 602 by coupling components 616. The coupling components 616 may electrically and mechanically couple the package-on-interposer structure 636 to the circuit board 602, and may include solder balls (as shown in FIG. 6), male and female portions of a socket, an adhesive, an underfill material, and/or any other suitable electrical and/or mechanical coupling structure.

The package-on-interposer structure 636 may include an IC package 620 coupled to an interposer 604 by coupling components 618. The coupling components 618 may take any suitable form for the application, such as the forms discussed above with reference to the coupling components 616. Although a single IC package 620 is shown in FIG. 6, multiple IC packages may be coupled to the interposer 604. It is to be appreciated that additional interposers may be coupled to the interposer 604. The interposer 604 may provide an intervening substrate used to bridge the circuit board 602 and the IC package 620. The IC package 620 may be or include, for example, a die (the die 502 of FIG. 5B), or any other suitable component. Generally, the interposer 604 may spread a connection to a wider pitch or reroute a connection to a different connection. For example, the interposer 604 may couple the IC package 620 (e.g., a die) to a ball grid array (BGA) of the coupling components 616 for coupling to the circuit board 602. In the embodiment illustrated in FIG. 6, the IC package 620 and the circuit board 602 are attached to opposing sides of the interposer 604. In other embodiments, the IC package 620 and the circuit board 602 may be attached to a same side of the interposer 604. In some embodiments, three or more components may be interconnected by way of the interposer 604.

The interposer 604 may be formed of an epoxy resin, a fiberglass-reinforced epoxy resin, a ceramic material, or a polymer material such as polyimide. In some implementations, the interposer 604 may be formed of alternate rigid or flexible materials that may include the same materials described above for use in a semiconductor substrate, such as silicon, germanium, and other group III-V and group IV materials. The interposer 604 may include metal interconnects 610 and vias 608, including but not limited to through-silicon vias (TSVs) 606. The interposer 604 may further include embedded devices 614, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio-frequency (RF) devices, power amplifiers, power management devices, antennas, arrays, sensors, and microelectromechanical systems (MEMS) devices may also be formed on the interposer 604. The package-on-interposer structure 636 may take the form of any of the package-on-interposer structures known in the art.

The IC device assembly 600 may include an IC package 624 coupled to the first face 640 of the circuit board 602 by coupling components 622. The coupling components 622 may take the form of any of the embodiments discussed above with reference to the coupling components 616, and the IC package 624 may take the form of any of the embodiments discussed above with reference to the IC package 620.

The IC device assembly 600 illustrated in FIG. 6 includes a package-on-package structure 634 coupled to the second face 642 of the circuit board 602 by coupling components 628. The package-on-package structure 634 may include an IC package 626 and an IC package 632 coupled together by coupling components 630 such that the IC package 626 is disposed between the circuit board 602 and the IC package 632. The coupling components 628 and 630 may take the form of any of the embodiments of the coupling components 616 discussed above, and the IC packages 626 and 632 may take the form of any of the embodiments of the IC package 620 discussed above. The package-on-package structure 634 may be configured in accordance with any of the package-on-package structures known in the art.

Figure 7:
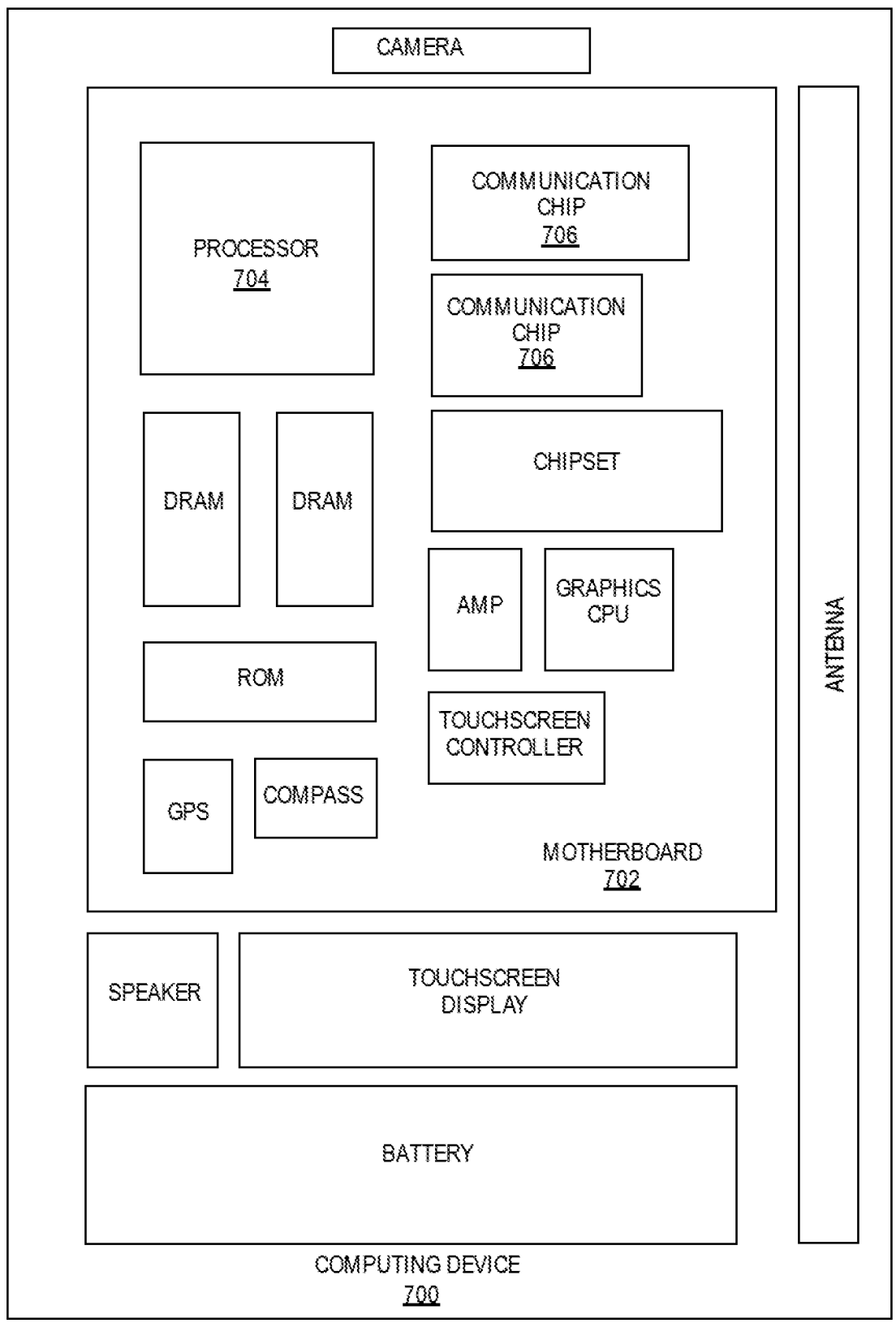
FIG. 7 illustrates a computing device in accordance with one implementation of the disclosure.

FIG. 7 illustrates a computing device 700 in accordance with one implementation of the disclosure. The computing device 700 houses a board 702. The board 702 may include a number of components, including but not limited to a processor 704 and at least one communication chip 706. The processor 704 is physically and electrically coupled to the board 702. In some implementations the at least one communication chip 706 is also physically and electrically coupled to the board 702. In further implementations, the communication chip 706 is part of the processor 704.

Depending on its applications, computing device 700 may include other components that may or may not be physically and electrically coupled to the board 702. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 706 enables wireless communications for the transfer of data to and from the computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 706 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 700 may include a plurality of communication chips 706. For instance, a first communication chip 706 may be dedicated to shorter range wireless communications such as Wi-Fi and Bluetooth and a second communication chip 706 may be dedicated to longer range wireless communications such as GPS, EDGE, GPRS, CDMA, WiMAX, LTE, Ev-DO, and others.

The processor 704 of the computing device 700 includes an integrated circuit die packaged within the processor 704. In some implementations of the disclosure, the integrated circuit die of the processor includes one or more embedded non-volatile memory structures having an AFM-based pSOT memory device, in accordance with implementations of embodiments of the disclosure. The term "processor" may refer to any device or portion of a device that processes electronic data from registers and/or memory to transform that electronic data into other electronic data that may be stored in registers and/or memory.

The communication chip 706 also includes an integrated circuit die packaged within the communication chip 706. In accordance with another implementation of embodiments of the disclosure, the integrated circuit die of the communication chip includes one or more embedded non-volatile memory structures having an AFM-based pSOT memory device, in accordance with implementations of embodiments of the disclosure.

In further implementations, another component housed within the computing device 700 may contain an integrated circuit die that includes one or more embedded non-volatile memory structures having an AFM-based pSOT memory device, in accordance with implementations of embodiments of the disclosure.

In various implementations, the computing device 700 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Thus, embodiments described herein include embedded non-volatile memory structures having AFM-based pSOT memory device elements.

The above description of illustrated implementations of embodiments of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The following examples pertain to further embodiments. The various features of the different embodiments may be variously combined with some features included and others excluded to suit a variety of different applications.

Example Embodiment 1

A memory device comprises an interconnect comprises a spin orbit coupling (SOC) material. A free magnetic layer is on the interconnect, a barrier material is over the free magnetic layer and a fixed magnetic layer is over the barrier material, wherein the free magnetic layer comprises an antiferromagnet.

Example Embodiment 2 the memory device of example embodiment 1, wherein the free magnetic layer comprises an AFM material including one of: Ir, Pt, Mn, Pd, Fe and a quasi-two-dimensional triangular AFM including Ni(1-x)MxGa2S4, where 'M' includes one of: Mn, Fe, Co or Zn.

Example Embodiment 3 the memory device of example embodiment 1 or 2, wherein the AFM material is approximately 1 to 20 nm in thickness.

Example Embodiment 4 the memory device of example embodiment 1, 2 or 3, wherein the SOC material of the interconnect includes 3D materials such as one or more of β-Tantalum (β-Ta), Ta, β-Tungsten (β-W), W, Pt, Copper (Cu) doped with elements such as Iridium, Bismuth and any of the elements of 3d, 4d, 5d and 4f, 5f periodic groups.

Example Embodiment 5 the memory device of example embodiment 1, 2 or 3, wherein the SOC material comprises one or more of: Pt, Ta, W, WOx, CuBi, BiOx, Bi2Se3, Bi2Sb3, SrIrO3, and a stack of LaAlO3 (LAO) and SrTiO3.

Example Embodiment 6 the memory device of example embodiment 1, 2, 3, 4 or 5, wherein the SOC material is approximately 1 to 20 nm in thickness.

Example Embodiment 7 the memory device of example embodiment 1, 2, 3, 4, 5 or 6, wherein a tunneling anisotropic magnetoresistance (TAMR) effect is used to read-out a canting magnetization state signal of the memory device.

Example Embodiment 8 the memory device of example embodiment 1, 2, 3, 4, 5, 6 or 7, wherein the interconnect comprising the SOC material, the free magnetic layer, the barrier material and the fixed magnetic layer comprise a tunneling AMR device stack.

Example Embodiment 9 the memory device of example embodiment 1, 2, 3, 4, 5, 6, 7 or 8, wherein during a write operation, a charge current is passed through the interconnect comprising the SOC material to induce spin currents that manipulate an antiferromagnetic state of the free magnetic layer into a first resistance state, which is detectable by the TAMR effect.

Example Embodiment 10 the memory device of example embodiment 1, 2, 3, 4, 5, 6, 7, 8 or 9, wherein during a read-out operation, a charge current is passed through a top of the tunneling AMR device stack to induce spin currents that manipulate an antiferromagnetic state of the free magnetic layer into a second resistance state that is read through the interconnect comprising the SOC material.

Example Embodiment 11 the memory device of example embodiment 1, 2, 3, 4, 5, 6, 7, 8, 9 or 10, wherein the fixed magnetic layer comprises a ferromagnet (FM) including any combination of Co, Fe, Ge, Ga, or one or more of Co, Fe, Ni alloys, multilayer hetero-structures, oxide ferromagnets, garnets, or Heusler alloys, and wherein the fixed magnetic layer is approximately 1 to 20 nm in thickness.

Example Embodiment 12 the memory device of example embodiment 1, 2, 3, 4, 5, 6, 7, 8, 9, 10 or 11, wherein the barrier material comprises a tunneling barrier material comprising one of Mg, Al, and Ti, and wherein the tunneling barrier material is approximately 0.5 to 10 nm in thickness.

Example Embodiment 13 the memory device of example embodiment 1, 2, 3, 4, 5, 6, 7, 8, 9, 10, 11 or 12, wherein the memory device comprises an AFM-based perpendicular spin orbit torque (pSOT) embedded MRAM or SRAM.

Example Embodiment 14

A memory device comprises a spin orbit coupling (SOC) interconnect and an antiferromagnet (AFM) free magnetic layer on the interconnect. A ferromagnetic magnetic tunnel junction (MTJ) device is on the AFM free magnetic layer, wherein the ferromagnetic MTJ comprises a free magnetic layer, a fixed magnetic layer, and a barrier material between the free magnetic layer and the fixed magnetic layer.

Example Embodiment 15 the memory device of example embodiment 14, wherein the free magnetic layer comprises an AFM material including one of: Ir, Pt, Mn, Pd, Fe and a quasi-two-dimensional triangular AFM including Ni(1-x)MxGa2S4, where 'M' includes one of: Mn, Fe, Co or Zn.

Example Embodiment 16 the memory device of example embodiment 14 or 15, wherein the AFM material is approximately 1 to 20 nm in thickness.

Example Embodiment 17 the memory device of example embodiment 14, 15, or 16, wherein the SOC material of the interconnect includes 3D materials such as one or more of β-Tantalum (β-Ta), Ta, β-Tungsten (β-W), W, Pt, Copper (Cu) doped with elements such as Iridium, Bismuth and any of the elements of 3d, 4d, 5d and 4f, 5f periodic groups.

Example Embodiment 18 the memory device of example embodiment 14, 15, or 16, wherein the SOC material comprises one or more of: Pt, Ta, W, WOx, CuBi, BiOx, Bi2Se3, Bi2Sb3, SrIrO3, and a stack of LaAlO3 (LAO) and SrTiO3.

Example Embodiment 19 the memory device of example embodiment 14, 15, 16, 17 or 18, wherein the SOC material is approximately 1 to 20 nm in thickness.

Example Embodiment 20 the memory device of example embodiment 14, 15, 16, 17, 18 or 19, wherein the ferromagnetic MTJ is used to read-out a canting magnetization state signal of the memory device.

Example Embodiment 21 the memory device of example embodiment 14, 15, 16, 17, 18, 19 or 20, wherein the AFM free magnetic layer is coupled to the free magnetic layer of the ferromagnetic MTJ, and the SOC interconnect controls magnetization of the AFM free magnetic layer and the free magnetic layer of the MTJ.

Example Embodiment 22 the memory device of example embodiment 14, 15, 16, 17, 18, 19, 20 or 21, wherein during a write operation, a charge current is passed through the SOC interconnect to induce spin currents that manipulate an antiferromagnetic state of the AFM free magnetic layer and the free magnet layer of MTJ into a first resistance state, which is detectable by the TAMR effect.

Example Embodiment 23 the memory device of example embodiment 14, 15, 16, 17, 18, 19, 20, 21 or 22, wherein during a read-out operation, a charge current is passed through a top of the tunneling AMR device stack to induce spin currents that manipulate an antiferromagnetic state of the free magnetic layer and the free magnetic layer of MTJ into a second resistance state that is read through the interconnect comprising SOC material.

Example Embodiment 24

A method of fabricating an integrated circuit device comprises forming a SOC interconnect with a write electrode in an opening in a dielectric layer. An AFM-based pSOT material stack is formed on the SOC interconnect. A lithography step is performed to form a photoresist mask on an uppermost surface of the AFM-based pSOT material layer stack. The AFM-based pSOT material layer stack is patterned in alignment with the photoresist mask to form an AFM-based pSOT memory device. A second dielectric layer is deposited over the AFM-based pSOT memory device and an interconnect line is patterned over the second dielectric layer.

Example Embodiment 25 the method of example embodiment 24, further comprises forming the AFM-based pSOT material stack with an AFM material including one of: Ir, Pt, Mn, Pd, Fe, and a quasi-two-dimensional triangular AFM including Ni(1-x)MxGa2S4, where 'M' includes one of: Mn, Fe, Co or Zn.

What is claimed is:

1. A memory device, comprising:
an interconnect comprising a spin orbit coupling (SOC) material; and
a free magnetic layer on the interconnect, a barrier material over the free magnetic layer and a fixed magnetic layer over the barrier material, wherein the free magnetic layer comprises an antiferromagnet, wherein a tunneling anisotropic magnetoresistance (TAMR) effect is used to read-out a canting magnetization state signal of the memory device.

2. The memory device of claim 1, wherein the free magnetic layer comprises an AFM material including one of: Ir, Pt, Mn, Pd, Fe and a quasi-two-dimensional triangular AFM including Ni(1-x)MxGa2S4, where 'M' includes one of: Mn, Fe, Co or Zn.

3. The memory device of claim 2, wherein the AFM material is approximately 1 to 20 nm in thickness.

4. The memory device of claim 1, wherein the SOC material of the interconnect includes 3D materials such as one or more of β-Tantalum (β-Ta), Ta, β-Tungsten (β-W), W, Pt, Copper (Cu) doped with elements such as Iridium, Bismuth and any of the elements of 3d, 4d, 5d and 4f, 5f periodic groups.

5. The memory device of claim 1, wherein the SOC material comprises one or more of: Pt, Ta, W, WOx, CuBi, BiOx, Bi2Se3, Bi2Sb3, SrIrO3, and a stack of LaAlO3 (LAO) and SrTiO3.

6. The memory device of claim 1, wherein the SOC material is approximately 1 to 20 nm in thickness.

7. The memory device of claim 1, wherein the interconnect comprising the SOC material, the free magnetic layer, the barrier material and the fixed magnetic layer comprise a tunneling AMR device stack.

8. The memory device of claim 1, wherein during a write operation, a charge current is passed through the interconnect comprising the SOC material to induce spin currents that manipulate an antiferromagnetic state of the free magnetic layer into a first resistance state, which is detectable by the TAMR effect.

9. The memory device of claim 1, wherein during a read-out operation, a charge current is passed through a top of the tunneling AMR device stack to induce spin currents that manipulate an antiferromagnetic state of the free magnetic layer into a second resistance state that is read through the interconnect comprising the SOC material.

10. The memory device of claim 1, wherein the fixed magnetic layer comprises a ferromagnet (FM) including any combination of Co, Fe, Ge, Ga, or one or more of Co, Fe, Ni alloys, multilayer hetero-structures, oxide ferromagnets, garnets, or Heusler alloys, and wherein the fixed magnetic layer is approximately 1 to 20 nm in thickness.

11. The memory device of claim 1, wherein the barrier material comprises a tunneling barrier material comprising one of Mg, Al, and Ti, and wherein the tunneling barrier material is approximately 0.5 to 10 nm in thickness.

12. The memory device of claim 1, wherein the memory device comprises an AFM-based perpendicular spin orbit torque (pSOT) embedded MRAM or SRAM.

13. A memory device, comprising:
a spin orbit coupling (SOC) interconnect;
an antiferromagnet (AFM) free magnetic layer on the SOC interconnect; and
a ferromagnetic magnetic tunnel junction (MTJ) device on the AFM free magnetic layer, wherein the ferromagnetic MTJ comprises a free magnetic layer, a fixed magnetic layer, and a barrier material between the free magnetic layer and the fixed magnetic layer, wherein the ferromagnetic MTJ is used to read-out a canting magnetization state signal of the memory device.

14. The memory device of claim 13, wherein the free magnetic layer comprises an AFM material including one of: Ir, Pt, Mn, Pd, Fe and a quasi-two-dimensional triangular AFM including Ni(1-x)MxGa2S4, where 'M' includes one of: Mn, Fe, Co or Zn.

15. The memory device of claim 14, wherein the AFM material is approximately 1 to 20 nm in thickness.

16. The memory device of claim 13, wherein SOC material of the SOC interconnect includes 3D materials such as one or more of β-Tantalum (β-Ta), Ta, β-Tungsten (β-W), W, Pt, Copper (Cu) doped with elements such as Iridium, Bismuth and any of the elements of 3d, 4d, 5d and 4f, 5f periodic groups.

17. The memory device of claim 13, wherein the SOC material comprises one or more of: Pt, Ta, W, WOx, CuBi, BiOx, Bi2Se3, Bi2Sb3, SrIrO3, and a stack of LaAlO3 (LAO) and SrTiO3.

18. The memory device of claim 13, wherein the SOC material is approximately 1 to 20 nm in thickness.

19. The memory device of claim 13, wherein the AFM free magnetic layer is coupled to the free magnetic layer of the ferromagnetic MTJ, and the SOC interconnect controls magnetization of the AFM free magnetic layer and the free magnetic layer of the ferromagnetic MTJ.

20. The memory device of claim 19, wherein during a write operation, a charge current is passed through the SOC interconnect to induce spin currents that manipulate an antiferromagnetic state of the AFM free magnetic layer and the free magnetic layer of the ferromagnetic MTJ into a first resistance state, which is detectable by the TAMR effect.

21. The memory device of claim 19, wherein during a read-out operation, a charge current is passed through a top of the tunneling AMR device stack to induce spin currents that manipulate an antiferromagnetic state of the free magnetic layer and the free magnetic layer of the ferromagnetic MTJ into a second resistance state that is read through the interconnect comprising SOC material.

* * * * *